US011639426B2

(12) United States Patent
Ito et al.

(10) Patent No.: US 11,639,426 B2
(45) Date of Patent: May 2, 2023

(54) HEAT CONDUCTION SHEET, METHOD OF MANUFACTURING HEAT CONDUCTION SHEET, AND HEAT DISSIPATING DEVICE

(71) Applicant: HITACHI CHEMICAL COMPANY, LTD., Tokyo (JP)

(72) Inventors: Akihiro Ito, Tokyo (JP); Michiaki Yajima, Tokyo (JP); Mika Kobune, Tokyo (JP); Takahiro Ikabata, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 910 days.

(21) Appl. No.: 16/474,139

(22) PCT Filed: Dec. 28, 2016

(86) PCT No.: PCT/JP2016/089079
§ 371 (c)(1),
(2) Date: Jun. 27, 2019

(87) PCT Pub. No.: WO2018/123012
PCT Pub. Date: Jul. 5, 2018

(65) Prior Publication Data
US 2020/0247963 A1 Aug. 6, 2020

(51) Int. Cl.
*C08L 23/08* (2006.01)
*C08L 23/16* (2006.01)
*C08L 23/22* (2006.01)
*C08L 101/00* (2006.01)
*C08J 5/18* (2006.01)
*C08K 3/04* (2006.01)
*C08K 5/00* (2006.01)
*C08K 7/24* (2006.01)
*H01L 23/373* (2006.01)

(52) U.S. Cl.
CPC ............ *C08J 5/18* (2013.01); *C08K 3/04* (2013.01); *C08K 5/005* (2013.01); *C08K 7/24* (2013.01); *C08L 23/0815* (2013.01); *C08L 23/16* (2013.01); *C08L 23/22* (2013.01); *C08L 101/00* (2013.01); *H01L 23/3737* (2013.01)

(58) Field of Classification Search
CPC .... C08L 23/08; C08L 23/087; C08L 23/0815; C08L 23/22
See application file for complete search history.

(56) References Cited

U.S. PATENT DOCUMENTS

| 2003/0151898 | A1 | 8/2003 | Tetsuka et al. |
| 2008/0039575 | A1 | 2/2008 | Mercx |
| 2014/0015000 | A1 | 1/2014 | Nishiyama et al. |
| 2014/0264818 | A1 | 9/2014 | Lowe, Jr. et al. |
| 2018/0163114 | A1* | 6/2018 | Yang ............... C09K 5/14 |

FOREIGN PATENT DOCUMENTS

| CN | 101535383 | A | | 9/2009 |
| CN | 103547644 | A | | 1/2014 |
| JP | H11-121953 | A | | 4/1999 |
| JP | 2001-250894 | A | | 9/2001 |
| JP | 2002-26202 | A | | 1/2002 |
| JP | 2003-026827 | A | | 1/2003 |
| JP | 2003-218296 | A | | 7/2003 |
| JP | 2008-280496 | A | | 11/2008 |
| JP | 2008-291220 | A | | 12/2008 |
| JP | 2012-023335 | A | | 2/2012 |
| JP | 2012-040811 | A | | 3/2012 |
| JP | 2012040811 | A | * | 3/2012 |
| JP | 2013-16647 | A | | 1/2013 |
| JP | 2015-036383 | A | | 2/2015 |
| TW | 201209972 | A | | 3/2012 |
| TW | I507516 | B | | 11/2015 |
| WO | 2012/133587 | A1 | | 10/2012 |
| WO | 2015/035575 | A1 | | 3/2015 |
| WO | 2015/050263 | A1 | | 4/2015 |

OTHER PUBLICATIONS

JP 2012040811 A machine translation (2012).*

* cited by examiner

Primary Examiner — Ana L. Woodward
(74) Attorney, Agent, or Firm — Fitch, Even, Tabin & Flannery, LLP

(57) ABSTRACT

A heat conduction sheet, includes at least one kind of graphite particle (A) selected from the group consisting of scale-like particles, ellipsoidal particles and rod-like particles; a polymer (B) having an isobutylene structure; an ethylene-propylene copolymer (C); and an ethylene octene elastomer (D), in which, in a case of scale-like particles, a plane direction of the particle is oriented in a thickness direction of the heat conduction sheet, and in a case of ellipsoidal particles or rod-like particles, a long axis direction of the particle is oriented in the thickness direction of the heat conduction sheet.

18 Claims, No Drawings

HEAT CONDUCTION SHEET, METHOD OF MANUFACTURING HEAT CONDUCTION SHEET, AND HEAT DISSIPATING DEVICE

CROSS-REFERENCE TO RELATED APPLICATION

This application is a U.S. national phase application filed under 35 U.S.C. § 371 of International Application No. PCT/JP2016/089079, filed Dec. 28, 2016, designating the United States, the entire contents of which is hereby incorporated herein by reference.

TECHNICAL FIELD

The present invention relates to a heat conduction sheet, method of manufacturing the heat conduction sheet, and a heat dissipating device.

BACKGROUND ART

In recent years, the amount of heat generation increases due to high density of mounting density of the wiring and the electronic component in the semiconductor package using a multilayered wiring board, and the amount of heat generation per unit area increases due to the high integration of semiconductor devices. There is a growing demand for increased heat dissipation from semiconductor packages.

In general, a heat dissipating device for dissipating heat by closely adhering a heat conduction grease or a heat conduction sheet between a heat generating body such as a semiconductor package and a heat dissipating body such as aluminum or copper is simply used. In general, heat conduction sheets are superior to heat conduction greases in workability when assembling the heat dissipating device.

In recent years, chips of CPU (central processing unit) tend to be larger in area by multi-core and multi-chip. Further, there is a tendency to lower the pressure of pressure bonding between CPU that is a heat generating body and a heat dissipating body. Therefore, the heat conduction sheet is required to have flexibility at the time of pressure bonding. Further, the heat conduction sheet is required to be excellent in the thermal conductivity so that even if the heat conduction sheet becomes thick due to the chip level difference, the heat conduction sheet has a low thermal resistance.

As a method of bringing the heat generating body and the heat dissipating body into close contact with each other via the heat conduction sheet, there may be mentioned a method of pressing with a jig such as a spring at normal temperature and a method of heat and pressure bonding. In any of the methods, it is important for achieving high adhesion that the heat conduction sheet is sufficiently flexible at the temperature at the time of adhesion.

As a method of heat and pressure bonding, there may be mentioned a method of melt and pressure bonding a heat generating body and a heat dissipating body using a low melting point metal such as metal indium as a heat conduction sheet. In this method, although the obtained heat dissipating device is extremely excellent in the thermal conductivity, it may be difficult to separate the heat dissipating body from the heat generating body for repair or the like. Further, since the melt of the metal has a low viscosity, the metal may flow out when reheating to a temperature exceeding the melting point. From such a point of view, a resin-based heat conduction sheet capable of maintaining viscosity even when heated is advantageous, but generally, the resin-based heat conduction sheet is inferior in the thermal conductivity to metallic indium and the like.

On the other hand, in the method of pressing with a jig such as a spring at room temperature, in general, a so-called phase change sheet is also used, in which high adhesion is obtained by melting from a solid sheet to a liquid fluid by melting due to heat generated by the operation of a semiconductor element or the like. However, in general, the phase change sheet has a low thermal conductivity, and it has a low thermal resistance by being liquefied to be thinner, so it is difficult to cope with the multi-chip formation in which the chip level difference occurs.

As the heat conduction sheet, it is also known a resin sheet filled with heat conduction filler. As a resin sheet excellent in the thermal conductivity filled with the heat conduction filler, various resin sheets have been proposed in which inorganic particles with a high thermal conductivity are selected as the heat conduction filler, and further the inorganic particles are oriented perpendicularly to the sheet surface.

For example, the heat conduction sheet (see, for example, Patent Literature 1) in which a heat conduction filler (boron nitride) is oriented in a direction substantially perpendicular to the sheet surface, and the heat conduction sheet (see, for example, Patent Literature 2) having the structure that carbon fibers dispersed in a gel-like substance is oriented perpendicular to the sheet surface has been proposed.

CITATION LIST

Patent Literature

Patent Literature 1: Japanese Patent Application Laid-Open (JP-A) No. 2002-26202
Patent Literature 2: Japanese Patent Application Laid-Open (JP-A) No. 2001-250894

SUMMARY OF INVENTION

Technical Problem

However, in general, a resin-type heat conduction sheet tends to oxidize or hydrolyze, in some cases, a plasticizer tends to volatilize, or the resin tends to be hard due to the progress of crosslinking and the like, exposed to heat or moisture by use. Therefore, the heat conduction sheet cannot be deformed following the thermal expansion of the member due to temperature fluctuation, with the result that the adhesion of the heat conduction sheet tends to be lowered, the heat resistance tends to be increased, and the thermal conductivity tends to be lowered.

It is an object of one embodiment of the present invention to provide a heat conduction sheet with a low thermal resistance.

Solution to Problem

Specific means for addressing the above problem include the following aspects.

<1>A heat conduction sheet, comprising:
at least one kind of graphite particle (A) selected from the group consisting of scale-like particles, ellipsoidal particles and rod-like particles;
a polymer (B) having an isobutylene structure;
an ethylene-propylene copolymer (C); and
an ethylene octene elastomer (D), wherein, in a case of scale-like particles, a plane direction of the particle is oriented in a thickness direction of the heat conduction sheet, and in a case of ellipsoidal particles or rod-like particles, a long axis direction of the particle is oriented in the thickness direction of the heat conduction sheet.

<2> A heat conduction sheet, comprising:

at least one kind of graphite particle (A) selected from the group consisting of scale-like particles, ellipsoidal particles and rod-like particles; and a resin component having a storage elastic modulus G' at 150° C. of 8 Pa·s or more, wherein, in a case of scale-like particles, a plane direction of the particle is oriented in a thickness direction of the heat conduction sheet, and in a case of ellipsoidal particles or rod-like particles, a long axis direction of the particle is oriented in the thickness direction of the heat conduction sheet.

<3> A heat conduction sheet, comprising:

at least one kind of graphite particle (A) selected from the group consisting of scale-like particles, ellipsoidal particles and rod-like particles; and a resin component, wherein:

compression set (%) after treatment at 150° C. is 4% or less, and in a case of scale-like particles, a plane direction of the particle is oriented in a thickness direction of the heat conduction sheet, and in a case of ellipsoidal particles or rod-like particles, a long axis direction of the particle is oriented in the thickness direction of the heat conduction sheet.

<4> A heat conduction sheet, comprising:

at least one kind of graphite particle (A) selected from the group consisting of scale-like particles, ellipsoidal particles and rod-like particles; and a resin component, wherein:

an arithmetic mean roughness of a surface of the sheet is 2.1 μm or less, and in a case of scale-like particles, a plane direction of the particle is oriented in a thickness direction of the heat conduction sheet, and in a case of ellipsoidal particles or rod-like particles, a long axis direction of the particle is oriented in the thickness direction of the heat conduction sheet.

<5> A heat conduction sheet, comprising:

at least one kind of graphite particle (A) selected from the group consisting of scale-like particles, ellipsoidal particles and rod-like particles; and a resin component, wherein:

a porosity of the sheet is 10% or less, and in a case of scale-like particles, a plane direction of the particle is oriented in a thickness direction of the heat conduction sheet, and in a case of ellipsoidal particles or rod-like particles, a long axis direction of the particle is oriented in the thickness direction of the heat conduction sheet.

<6> The heat conduction sheet according to any one of <1> to <5>, wherein the graphite particle (A) includes a scale-like particle that comprises an expanded graphite particle.

<7> The heat conduction sheet according to any one of <1> to <6>, further comprising an alicyclic hydrocarbon resin (E).

<8> The heat conduction sheet according to any one of <1> to <7>, further comprising an antioxidant.

<9> The heat conduction sheet according to any one of <1> to <8>, wherein a content ratio of the graphite particle (A) is from 15% by volume to 50% by volume.

<10> A method of manufacturing the heat conduction sheet according to <1>, comprising:

preparing a composition comprising: at least one kind of graphite particle (A) selected from the group consisting of scale-like particles, ellipsoidal particles and rod-like particles; a polymer (B) having an isobutylene structure; an ethylene-propylene copolymer (C); and an ethylene octene elastomer (D);

forming the composition into a sheet;

producing a layered body by stacking a plurality of the sheets, folding one of the sheets, or rolling one of the sheets; and slicing a side end face of the layered body.

<11> A heat dissipating device, comprising the heat conducting sheet according to any one of <1> to <9> interposed between a heat generating body and a heat dissipating body.

Advantageous Effects of Invention

According to the present invention, a heat conduction sheet with a low thermal resistance can be provided.

DESCRIPTION OF EMBODIMENTS

Hereinafter, modes for carrying out the present invention will be described in detail. However, the present invention is not limited to the following embodiments. In the following embodiments, the constituent elements (including element steps and the like) are not essential unless otherwise specified. The same applies to numerical values and ranges thereof, and does not limit the present invention.

In the present specification, the term "step" includes, in addition to steps independent of other steps, such steps as long as the purpose of the step is achieved even if it cannot be clearly distinguished from other steps.

In the present specification, those numerical ranges that are expressed with "to" each denote a range that includes the numerical values stated before and after "to" as the minimum value and the maximum value, respectively.

In a set of numerical ranges that are stated stepwise in the present specification, the upper limit value or the lower limit value of a numerical range may be replaced with the upper limit value or the lower limit value of other numerical range. Further, in a numerical range stated in the present specification, the upper limit value or the lower limit value of the numerical range may be replaced with a value indicated in Examples.

In the present specification, when there are plural kinds of substances that correspond to a component of a composition, the indicated content ratio of the component in the composition means, unless otherwise specified, the total content ratio of the plural kinds of substances existing in the composition.

In the present specification, when there are plural kinds of particles that correspond to a component of a composition, the indicated particle size of the component in the composition means, unless otherwise specified, a value determined for a mixture of the plural kinds of particles existing in the composition.

In the present specification, the term "layer" includes, in addition to the case where the region is entirely formed, that when the region where the layer is present is observed, it is formed in only a part of the region.

In the present specification, the term "layered" refers to stacking layers, two or more layers may be combined, and two or more layers may be removable.

First Embodiment

Heat Conduction Sheet

A heat conduction sheet of first embodiment includes at least one kind of graphite particle (A) (hereinafter also referred to as "graphite particle (A)") selected from the group consisting of scale-like particles, ellipsoidal particles and rod-like particles; a polymer (B) (hereinafter also referred to as "a polymer (B)") having an isobutylene structure; an ethylene-propylene copolymer (C); and an ethylene octene elastomer (D), in which, in a case of scale-like particles, a plane direction of the particle is oriented in a thickness direction of the heat conduction sheet, and in a case of ellipsoidal particles or rod-like particles, a long axis direction of the particle is oriented in the thickness direction of the heat conduction sheet.

With such a configuration, the heat conduction sheet has a low heat resistance and is excellent in the thermal conductivity.

<Graphite Particle>

The heat conduction sheet includes at least one kind of graphite particle (A).

Graphite particle (A) is considered to function mainly as a high thermal conductivity filler. Graphite particle (A) is at least one kind selected from the group consisting of scale-like particles, ellipsoidal particles and rod-like particles. In a case of scale-like particles, a plane direction of the particle is oriented in a thickness direction of the heat conduction sheet, and in a case of ellipsoidal particles or rod-like particles, a long axis direction of the particle is oriented in the thickness direction of the heat conduction sheet. It is preferable that the six-membered ring plane is oriented in a plane direction of the particle in a case of scale-like particles, is oriented in a long axis direction of the particle in a case of ellipsoidal particles, and is oriented in a long axis direction in a case of rod-like particles.

It is more preferable that a shape of graphite particle (A) is scale-like. By selecting a scale-like graphite particle, the thermal conductivity tends to be further improved. This reason can be considered, for example, for the scale-like graphite particles to be more easily oriented in a predetermined direction in the heat conduction sheet. Further a six-membered ring plane is a plane in which a six-membered ring is formed in a hexagonal system, and means a (0001) crystal plane.

Whether the six-membered ring plane in the crystal is oriented in the plane direction of scale-like particles, the long axis direction of ellipsoidal particles or the long axis direction of rod-like particles, it can be confirmed by X-ray diffraction measurement. The orientation direction of the six-membered ring plane in the crystal of the graphite particle (A) is specifically confirmed by the following method.

At first, a sample sheet for measurement in which the plane direction of scale-like particles, the long axis direction of ellipsoidal particles or the long axis direction of rod-like particles in the graphite particle (A) is oriented along the sheet direction is prepared. As a specific preparation method of the measurement sample sheet, for example, the following method may be mentioned.

A mixture of a resin and the graphite particles (A) in an amount of 10% by volume or more with respect to the resin is sheeted. The "resin" used herein is not particularly limited as long as a material that does not exhibit a peak that interferes with X-ray diffraction and that can form a sheet. Specifically, an amorphous resin having a cohesive force as a binder can be used, such as acrylic rubber, NBR (acrylonitrile butadiene rubber), SIBS (styrene-isobutylene-styrene copolymer), and the like.

The sheet of this mixture is pressed so as to be 1/10 or less of the original thickness, and a plurality of pressed sheets are layered to form a layered body. The operation of further crushing this layered body to the thickness of 1/10 or less is repeated three times or more to obtain a sample sheet for measurement. By this operation, in a case of scale-like particles, a plane direction of the particle is oriented in a plane direction of the sample sheet, in a case of ellipsoidal particles, a long axis direction of the particle is oriented in the plane direction of the sample sheet, and in a case of rod-like particles, a long axis direction of the particle is oriented in the plane direction of the sample sheet.

The X-ray diffraction measurement is performed to the surface of the measurement sample sheet prepared as described above. The height $H_1$ of the peak corresponding to the (110) plane of graphite appearing around $2\theta=77°$ and the height $H_2$ of the peak corresponding to the (002) plane of graphite appearing around $2\theta=27°$ are measured. In the measurement sample sheet prepared in this manner, the value obtained by dividing $H_1$ by $H_2$ is 0 to 0.02.

From this, it can be seen that "the six-membered ring plane in the crystal of the graphite particles (A) is oriented in the plane direction of scale-like particles, the long axis direction of ellipsoidal particles or the long axis direction of rod-like particles" means that X-ray diffraction measurement is performed on the surface of the sheet including the graphite particles (A), and the value obtained by dividing the peak height corresponding to the (110) plane of the graphite particles (A) appearing around $2\theta=77°$ by the peak height corresponding to the (002) plane of the graphite particle (A) appearing near $2\theta=27°$ is 0 to 0.02.

In the present specification, X-ray diffraction measurement is performed under the following conditions.

Device: Bruker AXS KK "D8DISCOVER"
X-ray source: CuKα wavelength 1.5406 nm, 40 kV, 40 mA
Step (measurement step size): 0.01°
Step time: 720 sec Here, "in a case of scale-like particles, a plane direction of the particle is oriented in a thickness direction of the heat conduction sheet, and in a case of ellipsoidal particles or rod-like particles, a long axis direction of the particle is oriented in the thickness direction of the heat conduction sheet" means that the angle (hereinafter also referred to as "orientation angle") between a plane direction in a case of scale-like particles, a long axis direction in a case of ellipsoidal particles or a long axis direction in a case of rod-like particles, and the surface of the heat conduction sheet is 60° or more. The orientation angle is preferably 80° or more, more preferably 85° or more, and still more preferably 88° or more.

The orientation angle is an average value when the cross section of the heat conduction sheet is observed with SEM (scanning electron microscope), and the angle (orientation angle) between a plane direction in a case of scale-like particles, a long axis direction in a case of ellipsoidal particles or a long axis direction in a case of rod-like particles, and the surface of the heat conduction sheet for arbitrary 50 graphite particles (A) is measured.

The particle size of the graphite particles (A) is not particularly limited. The average particle size of the graphite particles (A) is preferably a half of the average thickness to the average thickness of the heat conduction sheet. When the average particle size of the graphite particles (A) is a half or more of the average thickness of the heat conduction sheet, an efficient heat conduction path tends to be formed in the heat conduction sheet, and the thermal conductivity tends to be improved. When the average particle size of the graphite particles (A) is equal to or less than the average thickness of the heat conduction sheet, the protrusion of the graphite particles (A) from the surface of the heat conduction sheet is suppressed, and the adhesion of the surface of the heat conduction sheet tends to be excellent.

In the case of using the stacked slice method as described in JP-A No. 2008-280496, the particle size of the graphite particles (A) used as the raw material, as a mass average particle size, is preferably a half times or more of the average thickness of the heat conduction sheet, and may exceed the average thickness. The reason why the particle size of the graphite particles (A) used as the raw material may exceed the average thickness of the heat conduction sheet is, for example, even if the graphite particles (A) having a particle size exceeding the average thickness of the heat conduction sheet are included, because the graphite particles (A) are sliced to form the heat conduction sheet, the graphite particles (A) do not project from the surface of the heat conduction sheet as a result. Further, when the whole graphite particles (A) are sliced in this manner, a large number of graphite particles (A) penetrating in the thickness direction of the heat conduction sheet are generated, extremely efficient heat conduction paths are formed, and the heat conductivity tends to be further improved.

When using the stacked slice method, the particle size of the graphite particles (A) used as the raw material, as a mass average particle size is more preferably 1 to 5 times of the average thickness of the heat conduction sheet. When the mass average particle size of the graphite particles (A) is 1 or more times the average thickness of the heat conduction sheet, a more efficient heat conduction path is formed, and the thermal conductivity is further improved. When the average thickness of the heat conduction sheet is 5 times or less, the area of the surface of the graphite particles (A) can be prevented from being too large, and the decrease in the adhesion can be suppressed.

The mass average particle size of the graphite particles (A) (D50) is measured by using a laser diffraction type particle size distribution device adapted to laser diffraction scattering method (e.g., manufactured by Nikkiso Co., Ltd. "Microtrac Series MT3300"), and when the weight cumulative particle size distribution curve is drawn from the small particle size side, it corresponds to the particle size at which the weight cumulative becomes 50%.

The heat conduction sheet may include particles other than scale-like particles, ellipsoidal particles and rod-like particles as graphite particles, and may include spherical graphite particles, artificial graphite particles, exfoliated graphite particles, acid-treated graphite particles, expanded graphite particles, carbon fiber flakes and the like.

As the graphite particles (A), scale-like particles are preferable, and, from the viewpoint of easily obtaining a scaly having a high degree of crystallinity and a large particle size, scale-like expanded graphite particles obtained by pulverizing sheeted expanded graphite are preferable.

The particle size distribution of the graphite particles (A) is not particularly limited, and the particle size distribution with particle size on the horizontal axis and frequency on the vertical axis may be a monodisperse system with a single peak or the particle size distribution may be a polydisperse system with multiple peaks. Further, the particle size distribution may be narrow or broad.

As described above, large particles can form an efficient heat conduction path and are suitable from the viewpoint of the thermal conductivity, but if the large particles and the particle size distribution are narrow, the voids formed by the large particles also tend to be large, so that the variation in the thermal conductivity tends to be large in the plane of the heat conduction sheet. For this reason, it is preferable that the particle size distribution be somewhat broad or a polydispersed particle size distribution in which a plurality of peaks exist so that the small particles can be appropriately present and the voids generated by the large particles can be filled with small particles. The shape of the particle size distribution is not limited uniquely because it largely varies depending on the particle shape etc. However, for the above reasons, it is particular preferable that large particles having an average particle size close to the average thickness of the heat conduction sheet, and small particles having an average particle size smaller than the size of voids formed by the large particles are included, and the particle size distribution is such that small particles are included in an amount that fits in the void.

The content ratio of graphite particles (A) in the heat conduction sheet is, for example, fro m the viewpoint of the balance between the adhesion and the thermal conductivity is preferably 15% by volume to 50% by volume, more preferably 20% by volume to 45% by volume, and still more preferably 25% by volume to 40% by volume.

When the content ratio of the graphite particles (A) is 15% by volume or more, the thermal conductivity tends to be further improved. When the content ratio of the graphite particles (A) is 50% by volume or less, the decrease in the tackiness and the adhesion tends to be suppressed more effectively.

The content ratio of the graphite particles (A) (% by volume) is determined by the following Formula.

$$\text{Content ratio (\% by volume) of graphite particles (A)} = \{(Aw/Ad)/((Aw/Ad)+(Bw/Bd)+(Cw/Cd)+(Dw/Dd)+(Ew/Ed))\} \times 100$$

Aw: mass composition (% by mass) of graphite particles (A)

Bw: mass composition (% by mass) of polymer (B)

Cw: mass composition (% by mass) of ethylene-propylene copolymer (C)

Dw: mass composition (% by mass) of ethylene octene elastomer (D)

EW: mass composition (% by mass) of other optional ingredients

Ad: density of graphite particles (A) (in the present specification, Ad is calculated with 2.1)

Bd: density of polymer (B)

Cd: density of ethylene-propylene copolymer (C)

Dd: density of ethylene octene elastomer (D)

Ed: density of other optional ingredients

<Polymer (B) Having Isobutylene Structure>

The heat conduction sheet includes at least one kind of a polymer (B) having an isobutylene structure. Here, the "isobutylene structure" refers to "—$CH_2$—C $(CH_3)_2$—".

The polymer (B) having an isobutylene structure is considered to mainly function as, for example, a stress relaxation agent and a tackifier excellent in heat resistance and humidity resistance. Moreover, the cohesion and the fluidity at the time of heating can be further enhanced by using in combination with an alicyclic hydrocarbon resin (E)

described later. The polymer (B) having an isobutylene structure is not particularly limited as to the other structures as long as it includes an isobutylene structure. As a polymer (B) having the isobutylene structure, for example, a homopolymer of isobutene (alias: isobutylene) and a copolymer of isobutene and other monomer components are mentioned. Examples of the copolymer of isobutene and other mon omer components include a copolymer of isobutene and at least one of styrene and ethylene. The polymer (B) having an isobutylene structure is, from the viewpoint of achieving the toughness, the flexibility and the tackiness, preferably at least one kind selected of a group consisting of a copolymer of isobutene and styrene, a copolymer of isobutene and ethylene, and a homopolymer of isobutene.

The copolymer may be any of a random copolymer, a block copolymer and a graft copolymer, and is preferably a block copolymer (that is, a copolymer having a polyisobutylene structure).

The content ratio of the isobutylene structure in the copolymer is not particularly limited. For example, the content ratio of the isobutylene structure may be 40% by mass to 99% by mass, 50% by mass to 95% by mass, or 60% by mass to 95% by mass.

The polymer (B) having an isobutylene structure may be solid or liquid. In the present specification, "liquid" refers to a substance that exhibits fluidity and viscosity at 25° C. and has a viscosity of 0.0001 Pa·s to 1000 Pa·s at 25° C., which is a scale indicating viscosity. In the present specification, "viscosity" is defined as the value measured at a shear rate of 5.0s⁻ using a rheometer at 25° C. Specifically, "viscosity" is measured as shear viscosity at a temperature of 25° C. using a rotary shear viscometer fitted with a cone plate (diameter 40 mm, cone angle 0°). On the other hand, in the present specification, "solid" refers to those which do not fall under the above definition of "liquid".

The polymer having an isobutylene structure (B) may be used alone or in combination of two or more. For example, homopolymers of isobutene may be used in combination of solid and liquid.

The molecular weight of the polymer having an isobutylene structure (B) is not particularly limited. The solid homopolymer of isobutene preferably has the weight average molecular weight (Mw) or the viscosity average molecular weight (Mv) of preferably 40,000 or more, more preferably 40,000 to 100,000, and still more preferably 50,000 to 80,000.

When the weight average molecular weight (Mw) or the viscosity average molecular weight (Mv) of the solid homopolymer of isobutene is 40,000 or more, the adhesive strength required for temporary fixation can be obtained sufficiently, and the heat resistance tends to be excellent, and the strength of the heat conduction sheet also tends to be excellent. Further, when the viscosity average molecular weight is 100,000 or less, the compatibility with the alicyclic hydrocarbon resin (E) described later tends to be excellent.

In the present specification, the weight average molecular weight (Mw) is measured by GPC (Gel Permeation Chromatography). The viscosity average molecular weight (Mv) is measured by the FCC method.

In the GPC method, the weight average molecular weight is determined by converting from the molecular weight distribution using a standard polystyrene calibration curve. The calibration curve is approximated by a cubic equation using a 5 sample set of standard polystyrene (Tosoh Corp., PStQuick MP-H, PStQuick B). The measurement conditions of GPC in the present specification are shown below.

Device: (Pump: L-2130 (Hitachi High-Technologies Corporation))
(Detector: L-2490 RI [Hitachi High-Technologies Corporation])
(Column oven: L-2350 [Hitachi High-Technologies Corporation])
Column: Gelpack GL-R440+Gelpack GL-R450+Gelpack GL-R400M (total three)
(Hitachi Chemical Co., Ltd., trade name)
Column size: 10.7 mm (inner diameter)×300 mm
Eluent: Tetrahydrofuran
Sample concentration: 10 mg/2 mL
Injection volume: 200 µL
Flow rate: 2.05 mL/min
Measurement temperature: 25° C.

In the FCC method, the viscosity average molecular weight (Mv) is calculated from the following Mark-Houwink $$[\eta]=K\,Mv^\alpha$$

α and K are known constants determined by the measurement temperature, the type of solvent, and the type of polymer, respectively, and reference can be made to the chemical manual and the like. The intrinsic viscosity [η] is measured in accordance with JIS K7367-1:2002 (Plastics-Determination of the viscosity of an elastomer diluted solution using a capillary viscometer-).

The liquid homopolymer of isobutene preferably has the number average molecular weight (Mn) of preferably 1,000 to 3,000, more preferably 1,300 to 3,000, and still more preferably 2,000 to 3,000. When the number average molecular weight of the liquid homopolymer of isobutene is 3,000 or less, the softening effect tends to be sufficient, and when it is 1,000 or more, the heat resistance tends to be sufficient. The number average molecular weight (Mn) is measured by the VPO method (Vapor Pressure Osomometry).

In the VPO method, a homopolymer of isobutene is dissolved in a solvent, three or more sample solutions of different concentrations are prepared, and the molecular weight is determined by measuring the temperature difference caused by the change in enthalpy during condensation of the sample solutions and the pure solvent as a reference with a thermistor probe etc.

In the heat conduction sheet, the content ratio of the polymer (B) having an isobutylene structure is for example, from the viewpoint of further enhancing the adhesive strength, the adhesion, the sheet strength and the hydrolysis resistance, preferably 5% by volume to 50% by volume, more preferably 10% by volume to 40% by volume, and still more preferably 20% by volume to 30% by volume.

The content ratio of the polymer (B) having an isobutylene structure is 5% by volume or more, the tackiness and the adhesion tend to be further improved. The content ratio of the polymer (B) having an isobutylene structure is 50% by volume or less, a decrease in sheet strength and the thermal conductivity tend to be more effectively suppressed.

The heat conduction sheet may include another polymer in addition to the polymer (B) having an isobutylene structure. As another polymer, for example, polybutene is mentioned. The molecular weight of polybutene is not particularly limited.

The content ratio of polybutene may be 20% by volume or less, 10% by volume or less, or 5% by volume or less.

<Ethylene-Propylene Copolymer (C)>

The heat conduction sheet includes at least one kind of an ethylene-propylene copolymer (C). The ethylene-propylene copolymer (C) is considered to mainly contribute to, for example, improvement of moldability, elastic modulus at high temperature, and long-term heat resistance. Further, by using together with the ethylene octene elastomer (D) described later, the smoothness of the surface of the heat conduction sheet is improved, and the exudation of the resin component to the surface of the heat conduction sheet is suppressed so that a decrease in the thermal conductivity can be suppressed. Further, at the time of pressuring the heat conduction sheet, the sheet density can be increased while suppressing the exudation of the resin component.

The ethylene-propylene copolymer (C) may be a copolymer of ethylene and propylene, and the copolymerization ratio of ethylene and propylene (ethylene/propylene) is not particularly limited.

Further, the ethylene-propylene copolymer (C) may be a copolymer of ethylene and propylene, and a monomer (another monomer) other than these monomers. Another monomer includes linear, branched or cyclic olefin and vinyl compound having a carbon number of 4 or more.

The ethylene-propylene copolymer (C) may be any of a random copolymer, a block copolymer and a graft copolymer, and preferably a block copolymer (that is, a copolymer having a polyethylene structure and a polypropylene structure).

The molecular weight of the ethylene-propylene copolymer (C) is not particularly limited.

In the ethylene-propylene copolymer (C), the weight average molecular weight (Mw) is preferably 15000 or less, more preferably 2000 to 10000, and still more preferably 3000 to 8000.

Examples of the ethylene-propylene copolymer (C) include "Lucant HC-2000" and "Lucant HC-3000X" manufactured by Mitsui Chemicals, Inc.

In the heat conduction sheet, the content ratio of the ethylene-propylene copolymer (C) is for example, from the viewpoint of further enhancing elastic modulus at high temperature, preferably 10% by volume to 50% by volume, more preferably 15% by volume to 40% by volume, and still more preferably 20% by volume to 30% by volume.

<Ethylene Octene Elastomer (D)>

The heat conduction sheet includes at least one kind of an ethylene octene elastomer (D). The ethylene octene elastomer (D) is considered to mainly contribute to, for example, the improvement of elasticity and long-term heat resistance.

The ethylene octene elastomer (D) may be a copolymer of ethylene and 1-octene, and the copolymerization ratio of ethylene and 1-octene (ethylene/1-octene) is not particularly limited.

The molecular weight of the ethylene octene elastomer (D) is not particularly limited.

In the ethylene octene elastomer (D), the melt flow rate (MFR) (temperature 190° C., load 2.16 kg), which is an index of the molecular weight is preferably 50 g/10 min or less, more preferably 3 g/10 min to 40 g/10 min, and still more preferably 5 g/10 min to 35 g/10 min. In the present specification, the term "melt flow rate (MFR)" means melt flow rate (MFR) at a temperature of 190° C. and a load of 2.16 kg, unless otherwise specified. Melt flow rate (MFR) is synonymous with melt index. The measuring method is shown in JIS K7210:1999.

Examples of the ethylene-propylene copolymer (C) include "EOR8407" manufactured by Dow Chemical Company.

In the heat conduction sheet, the content ratio of the ethylene octene elastomer (D) is for example, from the viewpoint of suitably giving elasticity, preferably 5% by volume to 30% by volume, more preferably 5% by volume to 20% by volume, and still more preferably 5% by volume to 15% by volume.

<Alicyclic Hydrocarbon Resin (E)>

The heat conduction sheet may include at least one kind of an alicyclic hydrocarbon resin (E). For example, as described above, it is thought that the alicyclic hydrocarbon resin (E) exhibits an effect of being excellent in heat resistance and humidity resistance and improving the cohesion and the flowability at the time of heating by using it in combination with the polymer (B).

Examples of the alicyclic hydrocarbon resin (E) include hydrogenated aromatic petroleum resins, hydrogenated terpene phenol resins, and cyclopentadiene petroleum resins. These alicyclic hydrocarbon resins (E) can be appropriately selected from commercially available alicyclic hydrocarbon resins to be used.

Among them, the alicyclic hydrocarbon resin (E) is preferably at least one selected from a hydrogenated aromatic petroleum resin and a hydrogenated terpene phenol resin. These alicyclic hydrocarbon resins (E) have high stability and excellent compatibility with the polymer (B) having an isobutylene structure, and therefore, when the alicyclic hydrocarbon resin (E) composes the heat conduction sheet, better thermal conductivity, flexibility and handling tend to be achievable.

Examples of the hydrogenated aromatic petroleum resin include "Alcon" manufactured by Arakawa Chemical Industries, Ltd., and "Imarb" manufactured by Idemitsu Kosan Co., Ltd.

Moreover, examples of the hydrogenated terpene phenol resin include "Kuraron" manufactured by Yashara Chemical Co., Ltd.

Moreover, examples of the cyclopentadiene type petroleum resin include, "Zuinton" manufactured by Nippon Zeon Co., Ltd. and "marcarets" manufactured by Maruzen Petrochemical Co., Ltd.

The alicyclic hydrocarbon resin (E) is preferably solid at 25° C.

The alicyclic hydrocarbon resin (E) is preferably thermoplastic, and the softening temperature of the alicyclic hydrocarbon resin (E) is preferably 40° C. to 150° C. When a thermoplastic resin is used, as a result of the improvement of the softening flowability at the time of thermocompression bonding, the adhesion tends to be improved. Further, when the softening temperature is 40° C. or higher, the cohesion at around room temperature can be maintained, so that the required sheet strength tends to be easily obtained, and the handling property tends to be excellent. When the softening temperature is 150° C. or less, the softening flowability at the time of thermocompression bonding is increased, so that the adhesion tends to be improved. The softening temperature is more preferably 80° C. to 130° C. The softening temperature is measured by the ring and ball method (JIS K2207:1996).

The weight average molecular weight of the alicyclic hydrocarbon resin (E) is not particularly limited. From the viewpoint of strength and flexibility in the heat conduction sheet, the weight average molecular weight is preferably 200 to 10000, and more preferably 500 to 2000.

The content ratio of the alicyclic hydrocarbon resin (E) in the heat conduction sheet is for example, from the viewpoint of the adhesive strength, the adhesion, and the sheet strength, preferably 3% by volume to 20% by volume, more preferably 4% by volume to 15% by volume, and still more preferably 5% by volume to 10% by volume.

When the content ratio of the alicyclic hydrocarbon resin (E) is 5% by volume or more, the adhesion, the heat flowability, and the sheet strength tend to be sufficient, and when the content ratio of the alicyclic hydrocarbon resin (E) is 10% by volume or less, the flexibility tends to be sufficient so that handling and thermal cycle resistance tend to be excellent.

<Other ingredients>

The heat conduction sheet may include other ingredients other than the graphite particles (A), the polymer (B), the ethylene-propylene copolymer (C), the ethylene octene elastomer (D), and the alicyclic hydrocarbon resin (E) depending on the purpose. For example, the heat conduction sheet may include a flame retardant for the purpose of imparting flame retardancy.

The flame retardant is not particularly limited, and can be appropriately selected from commonly used flame retardants. For example, red phosphorus based flame retardants and phosphoric acid ester based flame retardants can be mentioned. Among them, phosphoric acid ester flame retardants are preferable from the viewpoint of excellent safety and improved adhesion due to plasticity.

As the red phosphorus based flame retardants, in addition to pure red phosphorus particles, those provided with various coatings for the purpose of enhancing safety or stability, or those made into a masterbatch may be used. Specific examples thereof include Nova Red, Nova Excel, Nova Cell, Nova Pellet (all trade names) manufactured by RIN KAGAKU KOGYO Co.,Ltd., and the like.

The phosphoric acid ester flame retardants include aliphatic phosphoric acid esters such as trimethyl phosphate, triethyl phosphate, and tributyl phosphate; aromatic phosphate esters such as triphenyl phosphate, tricresyl phosphate, cresyl diphenyl phosphate, trixylenyl phosphate, cresyl di 2,6-xylenyl phosphate, tris (t-butylated phenyl) phosphate, and tris (isopropylated phenyl) phosphate, triaryl isopropylated phosphate; aromatic condensed phosphoric acid esters such as resorcinol bisdiphenyl phosphate, bisphenol A bis (diphenyl phosphate), and resorcinol bisdixylenyl phosphate.

Among these, bisphenol A bis (diphenyl phosphate) is preferable from the viewpoint of being excellent in hydrolysis resistance and excellent in the effect of improving the adhesion by a plasticizing effect.

The content ratio of the flame retardant in the heat conduction sheet is not limited and may be used in an amount that flame retardancy is exhibited, preferably on the order 30% by volume or less, and from the viewpoint of suppressing the deterioration of the heat resistance due to the flame retardant component exuding to the surface of the heat conduction sheet, preferably 20% by volume or less.

The heat conduction sheet may optionally include an additive such as an antioxidant, a radical trapping agent, or a pH adjuster, and may preferably include an antioxidant. The content ratio of these additives in the heat conduction sheet is preferably 5% by volume or less, more preferably 3% by volume or less, and still more preferably 1% by volume or less.

The average thickness of the heat conduction sheet is not particularly limited, it can be appropriately selected depending on the purpose. Specifically, the average thickness of the heat conduction sheet can be 50 μm to 3000 μm, and from the viewpoint of the thermal conductivity and the adhesion, is preferably 100 μm to 1000 μm.

The average thickness of the heat conduction sheet is measured at three locations using a micrometer, and is given as an arithmetic average value.

The heat conduction sheet may have a protective film on at least one side, and preferably has a protective film on both sides. This can protect the adhesive side of the heat conduction sheet.

As the protective film, for example, resin films such as polyethylene, polyester, polypropylene, polyethylene terephthalate, polyimide, polyether imide, polyether naphthalate, methyl pentene, etc., coated paper, coated cloth, and metal foils such as aluminum are used. These protective films may be used alone or in combination of two or more as a multilayer film. The protective film is preferably surface-treated with a silicone-based or silica-based release agent.

In addition, a resin component including the polymer (B) having an isobutylene structure, the ethylene-propylene copolymer (C), the ethylene octene elastomer (D), and as required the alicyclic hydrocarbon resin (E), which are components of the heat conduction sheet of the present embodiment, preferably has a storage elastic modulus G' at 150° C. of 8 Pa·s or more, and more preferably 8 Pa·s to 50 Pa·s, and still more preferably 10 Pa·s to 25 Pa·s. Thus, the heat conduction sheet tends to have a lower thermal resistance and tends to be more excellent in the thermal conductivity. The storage elastic modulus G' at 150° C. of the resin component can be determined by the method described in the examples described later.

The above-mentioned resin component included in the heat conduction sheet preferably has a storage elastic modulus G' after treatment at 150° C. of 5 Paμs or more, and more preferably 7 Pa·s. As a result, even when the heat conduction sheet is exposed to high temperature for a long time, the heat conduction sheet tends to be more excellent in followability to the heating element and the thermal resistance tends to be lower. The storage elastic modulus G' after treatment at 150° C. of the resin component can be determined by the method described in the examples described later.

The heat reduction sheet preferably has a compression set (%) after treatment at 150° C. of 4% or less, more preferably 3% or less, and more preferably 0.5% to 2%. As a result, even when the heat conduction sheet is exposed to high temperature for a long time, the ability to conform to the heating element tends to be higher, and the thermal resistance tends to be lower. The compression set after treatment at 150° C. of the heat conduction sheet can be determined by the method described in the examples described later.

In the heat conduction sheet, the arithmetic mean roughness of the surface is preferably 2.1 μm or less, more preferably 1.9 μm or less, and still more preferably 1.4 μm to 1.8 μm, and particularly preferably 1.5 μm to 1.7 μm. As a result, the amount of air present in the gap between the heat conduction sheet and the heating element is reduced, and the thermal resistance tends to be lower. The arithmetic mean roughness of the surface of the heat conduction sheet can be determined by the method described in the examples described later.

The heat conduction sheet preferably has a porosity of 10% or less, more preferably 9% or less, still more preferably 4% to 8%, and particularly preferably 5% to 7%. As a result, the proportion of internal bubbles tends to be low and the thermal resistance tends to be lower. The porosity of the heat conduction sheet can be determined by the method described in the examples described later.

Further, from the viewpoint of enhancing the thermal conductivity, the heat conduction sheet preferably has a thermal resistance Rth ($K \cdot cm^2/W$) of 0.11 or less, more preferably 0.105 or less, still more preferably 0.1 or less, and particularly preferably 0.09 or less. The thermal resistance Rth (K·cm²/W) of the heat conduction sheet can be determined by the method described in the examples described later.

Second Embodiment

The heat conduction sheet of the second embodiment of the present invention is described below. The description of items in common with the first embodiment will be omitted.

A heat conduction sheet of the second embodiment includes at least one kind of graphite particle (A); and a resin component having a storage elastic modulus G' at 150° C. of 8 Pa·s or more, in which, in a case of scale-like particles, a plane direction of the particle is oriented in a thickness direction of the heat conduction sheet, and in a case of ellipsoidal particles or rod-like particles, a long axis direction of the particle is oriented in the thickness direction of the heat conduction sheet.

The heat conduction sheet of the present embodiment has a high elasticity at high temperature because the storage elastic modulus G' at 150° C. of the resin component is 8 Pa·s or more. For that reason, the heat conduction sheet has high ability to conform to the heating element when exposed to high temperature, and the heat resistance is reduced. Therefore, the heat conduction sheet of this embodiment has a low thermal resistance and is excellent in the thermal conductivity.

In the heat conduction sheet, when the arithmetic mean roughness of the surface is 2.1 μm or less in the arithmetic mean roughness of the surface described later, the surface roughness becomes low, the amount of air present in the gap between the heat conduction sheet and the heating element is reduced, and the thermal resistance is reduced. In the slicing step in the manufacturing method of the heat conduction sheet described later, when the storage elastic modulus G' at 150° C. of the resin component is 100 Pa·s or more, the hardness of the resin component becomes large, so that the strength of the cemented carbide blade used in the slicing step is insufficient, and the arithmetic mean roughness of the surface tends to be more than 2.1 μm. As a result, the arithmetic mean roughness of the surface of the heat conduction sheet after the slicing step becomes very large, so that the arithmetic mean roughness of the surface cannot be reduced to 2.1 μm or less even in the subsequent laminating step, and the thermal resistance tends to be large. Therefore, the storage elastic modulus G' at 150° C. of the resin component is preferably 8 Pa·s to 50 Pa·s, and more preferably 10 Pa·s to 25 Pa·s. The storage elastic modulus G' at 150° C. of the resin component can be determined by the method described in the examples described later.

The resin component included in the heat conduction sheet of this embodiment preferably has the storage elastic modulus G' after treatment at 150° C. of 5 Pa·s or more, more preferably 7 Pa·s. As a result, even when the heat conduction sheet is exposed to high temperature for a long time, the heat conduction sheet is excellent in the ability to follow the heating element and the thermal resistance is reduced. The storage elastic modulus G' after treatment at 150° C. of the resin component can be determined by the method described in the examples described later.

In the present embodiment, the resin component preferably includes the polymer (B) having an isobutylene structure, the ethylene-propylene copolymer (C), and the ethylene octene elastomer (D), and more preferably further includes the alicyclic hydrocarbon resin (E). Moreover, the heat conduction sheet of the present embodiment may include the other ingredients described above.

Third Embodiment

A heat conduction sheet of the third embodiment includes at least one kind of graphite particle (A); and a resin component, in which compression set (%) after treatment at 150° C. is 4% or less, and in a case of scale-like particles, a plane direction of the particle is oriented in a thickness direction of the heat conduction sheet, and in a case of ellipsoidal particles or rod-like particles, a long axis direction of the particle is oriented in the thickness direction of the heat conduction sheet.

In the present specification, "Compression set (%) after treatment at 150° C." is compression set (%) measured after heating the heat conduction sheet at 150° C. for 500 hours, using a microforce tester (Micro Tester 5948, manufactured by Instoron) to compress at 0.1 mm/min until the pressure applied to the heat conduction sheet per 1 cm² is pressurized to 20 Psi at a temperature of 150° C., after immediately after reaching 20 Psi, releasing at 0.1 mm/min until the pressure applied to the heat conduction sheet per 1 cm² reaches 0 Psi, and then standing at room temperature (25° C.) for 30 minutes.

Because the heat conduction sheet of this embodiment has compression set (%) after treatment at 150° C. of 4% or less, even when exposed to high temperatures for a long time, the ability to follow the heating element is high and the thermal resistance is low. Therefore, the heat conduction sheet of this embodiment has a low thermal resistance and is excellent in the thermal conductivity.

When the storage elastic modulus G' at 150° C. of the resin component of the heat conduction sheet is 100 Pa·s or more, the arithmetic mean roughness of the surface tends to be large due to the influence of the slicing step, and the thermal resistance tends to be large. Therefore, the storage elastic modulus G' at 150° C. of the resin component is preferably 8 Pa·s to 50 Pa·s, and more preferably 10 Pa·s to 25 Pa·s. In addition, the heat conduction sheet preferably has compression set (%) of 3% or less, and more preferably 0.5% to 2%. Compression set can be determined by the equation described in the examples described later.

In the present embodiment, the resin component preferably includes the polymer (B) having an isobutylene structure, the ethylene-propylene copolymer (C), and the ethylene-octene elastomer (D), and more preferably further includes the alicyclic hydrocarbon resin (E). Moreover, the heat conduction sheet of the present embodiment may include other ingredients described above.

Fourth Embodiment

A heat conduction sheet of the fourth embodiment includes at least one kind of graphite particle (A); and a resin component, in which an arithmetic mean roughness of a surface of the sheet is 2.1 μm or less, and in a case of scale-like particles, a plane direction of the particle is oriented in a thickness direction of the heat conduction sheet, and in a case of ellipsoidal particles or rod-like particles, a long axis direction of the particle is oriented in the thickness direction of the heat conduction sheet.

Because the heat conduction sheet of this embodiment has the arithmetic mean roughness of the surface of 2.1 μm or less, the surface roughness becomes low. As a result, the amount of air present in the gap between the heat conduction sheet and the heating element is reduced, and the thermal resistance tends to be lower. Therefore, the heat conduction sheet of this embodiment has a low thermal resistance and is excellent in the thermal conductivity.

In the heat conduction sheet, the arithmetic mean roughness of the surface, which could not be reduced by the slicing step, is made to be 2.1 µm or less by heating and pressing with a rubber roll laminator in the laminating step so that the thermal resistance may be reduced. Although the arithmetic mean roughness of the surface is reduced by the conditions of heating and pressure by the rubber roll laminator, the surface of the heat conduction sheet may be covered by the exudation of the resin component, the contact between the graphite particles and the heat sink may be prevented, and the thermal resistance may increase.

Therefore, from the viewpoint of suppressing the exudation of the resin component, the heat conduction sheet preferably has an arithmetic mean roughness of 1.9 µm or less, and more preferably 1.4 µm to 1.8 µm, and still more preferably 1.5 µm to 1.7 µm. The arithmetic mean roughness of the surface of the heat conduction sheet can be determined by the method described in the examples to be described later.

In the present embodiment, the resin component preferably includes the polymer (B) having an isobutylene structure, the ethylene-propylene copolymer (C), and the ethylene-octene elastomer (D), and more preferably further includes the alicyclic hydrocarbon resin (E). Moreover, the heat conduction sheet of the present embodiment may include other ingredients described above.

Fifth Embodiment

A heat conduction sheet of the fifth embodiment includes at least one kind of graphite particle (A); and a resin component, in which a porosity of the sheet is 10% or less, and in a case of scale-like particles, a plane direction of the particle is oriented in a thickness direction of the heat conduction sheet, and in a case of ellipsoidal particles or rod-like particles, a long axis direction of the particle is oriented in the thickness direction of the heat conduction sheet.

Because the heat conduction sheet of this embodiment has the porosity of the sheet is 10% or less, the ratio of internal air bubbles tends to be low, and the thermal resistance tends to be low. Therefore, the heat conduction sheet of this embodiment has a low thermal resistance and is excellent in the thermal conductivity.

In the heat conduction sheet, from the viewpoint of making the thermal resistance lower by reducing the ratio of internal air bubbles, the porosity is preferably 9% or less, more preferably 4% to 8%, and still more preferably 5% to 7%. The porosity P is calculated based on the following equation (1), where p is the bulk density of the heat conduction sheet, and p' is the true density of the heat conduction sheet.

$$\text{Porosity } P = [1-(p/p')] \times 100(\%) \quad \ldots \quad (1)$$

The heat conduction sheet, from the viewpoint of enhancing the thermal conductivity, the thermal resistance Rth (K·cm$^2$/W) is preferably 0.11 or less, more preferably 0.105 or less, still more preferably 0.1 or less, and particularly preferably 0.09 or less. The thermal resistance Rth (K·cm$^2$/W) can be determined by the method described in the examples to be described later.

In the present embodiment, the resin component preferably includes the polymer (B) having an isobutylene structure, the ethylene-propylene copolymer (C), and the ethylene-octene elastomer (D), and more preferably further includes the alicyclic hydrocarbon resin (E). Moreover, the heat conduction sheet of the present embodiment may include other ingredients described above.

The porosity and the thermal resistance can be adjusted by appropriately selecting the kinds and the contents of the graphite particles (A) and the resin component, preferably the graphite particles (A), the polymer having an isobutylene structure (B), ethylene-propylene copolymer (C) and the ethylene octene elastomer (D), and as required the alicyclic hydrocarbon resin (E) in the respective preferable ranges described above.

The configurations of the heat conduction sheets in the first to fifth embodiments may be combined as appropriate, and for example, numerical ranges of the physical property values related to the heat conduction sheets in the first to fifth embodiments described above may be combined as appropriate. Specifically, numerical ranges of the physical property values such as the storage elastic modulus G' at 150° C. of the resin component, the storage elastic modulus G' after treatment at 150° C. of the resin component, and compression set after treatment at 150° C. of the heat conduction sheet, arithmetic mean roughness of the surface of the heat conduction sheet, the porosity of the heat conduction sheet, the heat resistance of the heat conduction sheet and the like may be arbitrarily combined.

[Method of Manufacturing Heat Conduction Sheet]

A method of manufacturing the heat conduction sheet is not particularly limited as long a the above described construction can be obtained. As the manufacturing method of the heat conduction sheet, for example, the following method is mentioned.

The manufacturing method includes a step (also referred to as "preparation step") of preparing a composition including at least one kind of graphite particle (A) selected from the group consisting of scale-like particles, ellipsoidal particles and rod-like particles, the polymer (B) having an isobutylene structure, the ethylene-propylene copolymer (C), the ethylene octene elastomer (D), and as required the alicyclic hydrocarbon resin (E), a step (also referred to as "sheet forming step") of forming the composition into a sheet, a step (also referred to as "layered body producing step") of producing a layered body by stacking a plurality of the sheets, folding one of the sheets, or rolling one of the sheets, and a step (alsp referred to as "slicing step") of slicing a side end face of the layered body. Further, the manufacturing method of the heat conduction sheet may further includes a step (lamination step) of affixing the slice sheet obtained at the slicing step on a protective film to laminate the slice sheet.

By manufacturing the heat conduction sheet by such a method, an efficient heat conduction path is likely to be formed, and as a result, the heat conduction sheet excellent in a high thermal conductivity and the adhesion tends to be obtained.

<Preparation Step>

The preparation of the composition constituting the heat conduction sheet may be any method as long as the graphite particles (A), the polymer (B) having an isobutylene structure, the ethylene-propylene copolymer (C), the ethylene octene elastomer (D), as required the alicyclic hydrocarbon resin (E), other ingredients and the like can be uniformly mixed, and is not particularly limited. Further, the composition may be prepared by obtaining a commercial product. For details of the preparation of the composition, reference can be made to paragraph [0033] of JP-A No. 2008-280496.

<Sheet Forming Step>

The sheet forming step, when the composition obtained in the previous step can be formed into a sheet, may be any method, and is not particularly limited. For example, it is preferable to carry out using at least one forming method selected from the group consisting of rolling, pressing, extrusion, and coating. For details of the sheet forming step, reference can be made to paragraph of JP-A No. 2008-280496.

<Layered Body Producing Step>

The layered body producing step is a step to forming a layered body of sheets obtained in the previous step. The layered body is not limited to, for example, a form in which a plurality of independent sheets are sequentially stacked, and The layered body may be a form in which one sheet is folded without being cut or a form in which one sheet is rolled. For details of the layered body producing step, reference can be made to paragraphs [0035] to [0037] of JP-A No. 2008-280496.

<Slicing Step>

The slicing step, when the side end face of the layered body obtained in the previous step can be sliced, may be any method, and is not particularly limited. From the viewpoint that a very efficient heat conduction path is formed by the graphite particles (A) penetrating in the thickness direction of the heat conduction sheet and the thermal conductivity is further improved, it is preferable to slice by the thickness of 2 times or less of the mass average particle size of the graphite particles (A). For details of the slicing step, reference can be made to paragraph [0038] of JP-A No. 2008-280496.

<Lamination Step>

The lamination step, when the slice sheet obtained in the slicing step can be affixed on the protective film, may be any method, and is not particularly limited.

[Heat Dissipating Device]

The heat dissipating device, includes the heat conduction sheet described above interposed between a heat generating body and a heat dissipating body. By stacking the heat generating body and the heat dissipating body via the heat conduction sheet, the heat from the heat generating body can be efficiently conducted to the heat dissipating body. Further, the heat conduction sheet can be easily removed when removing the heat dissipating body from the heat generating body.

Because the temperature range in which the heat conduction sheet can be particularly suitably used is, for example, −10° C. to 150° C., examples of the heating element include semiconductor packages, displays, LEDs, lights, power modules for automobiles and industrial power modules may be mentioned as examples of suitable heating elements.

The heat dissipating body may be, for example, a fin of aluminum or copper, a heat sink using a plate or the like, a block of aluminum or copper connected to a heat pipe, a block of aluminum or copper circulating a cooling liquid inside the block with a pump, and a Peltier element and a block of aluminum or copper provided therewith.

The heat dissipating device is constituted by bringing the faces of the heat conduction sheet into contact with the heat generating body and the heat dissipating body. The method of bringing the heat generating body into contact with one side of the heat conduction sheet, and the method of bringing the heat dissipating body into contact with the other side of the heat conduction sheet, is not particularly limited as long as they can be fixed in close contact with each other in these methods.

Specifically, The method that the heat conduction sheet is placed between the heat generating body and the heat dissipating body, and fixed with a jig such as a clip that can be pressurized to about 0.1 MPa to 2 MPa, and the heat generating body heats up in this state or the heat conduction sheet is heated to about 80° C. to 180° C. by an oven or the like is mentioned. The preferred pressure range in this method is 0.15 MPa to 1 MPa, and the preferred temperature range is 100° C. to 170° C. When the pressure is 0.1 MPa or more or the heating temperature is 80° C. or more, excellent adhesion tends to be obtained. Further, when the pressure is 2 MPa or less or the heating temperature is 180° C. or less, the reliability of the adhesion tends to be further improved. This is considered to be because the heat conduction sheet can be suppressed from being excessively compressed and becoming thin, or distortion or residual stress of peripheral members becoming too large.

In the heat conduction sheet, the ratio (compression ratio) of the thickness decreased after pressure bonding to the initial thickness before being placed between the heat generating body and the heat dissipating body and being pressure bonded may be 5% to 35%.

In fixing, in addition to a clip, a jig such as a screw or a spring may be used, and in order to maintain close contact, it is preferable to further fix by means usually used such as an adhesive.

EXAMPLES

Hereinafter, the present invention will be described in more detail with reference to Examples, but the present invention is not limited to these Examples. In addition, "%" is a mass standard unless there is particular notice.

Example 1

The following materials were charged into 4 L pressure kneader, and kneaded under conditions of a temperature reached 170° C. to prepare a composition.

<Graphite Particles (A)>

Scale-like expanded graphite particles (manufactured by Hitachi Chemical Co., Ltd. "HG F-L", mass average particle size: 270 μm, by a method using X-ray diffraction measurement described above, it was confirmed that the six-membered ring face in the crystal is oriented in the plane direction of the scale-like particles.): 2369 g <Polymer (B)>

Homopolymer of isobutene (Shin Nippon Oil Co., Ltd. "Tetrax 6T", viscosity average molecular weight: 60000, solid at 25° C., density: 0.92 g/cm$^3$): 710 g <Ethylene-Propylene Copolymer (C)>

Ethylene-propylene copolymer (Mitsui Chemicals, Inc. "Lucant HC-2000", weight average molecular weight Mw <7000, liquid at 25° C., density: 0.85 g/cm$^3$): 565 g <Ethylene Octene Elastomer (D)>

Ethylene octene elastomer (Dow Chemical Company "EOR 8407", melt flow rate (MFR): 30 g/10 min, density: 0.87 g/cm$^3$): 245 g <Alicyclic Hydrocarbon Resin (E)>

Hydrogenated petroleum resin (Arakawa Chemical Industries, Ltd. "Arkon P90", density:

0.991 g/cm$^3$): 175 g

The contents (volume %) of each of (A) component, (B) component, (C) component, (D) component and (E) component with respect to the whole composition are in order 37.3% by volume, 25.5% by volume, 22.1% by volume, 9.3% by volume and 5.8% by volume as shown in Table 1 below.

Next, heat conduction sheets used to measure the arithmetic mean roughness and the thermal resistance were prepared. The heat conduction sheets used to measure the arithmetic mean roughness and the thermal resistance were prepared in four types by changing the preparation conditions as shown below.

(Preparation 1 of Heat Conduction Sheet)

First, the prepared composition was placed in an extruder and extruded into a flat plate having a width of 20 cm and a thickness of 1.5 mm to 1.6 mm to obtain a primary sheet. The obtained primary sheet is press punched using a 40 mm×150 mm die blade, and 61 sheets of the punched sheet were stacked, and a pressure was applied at 90° C. for 30 minutes in the stacking direction with the spacer of 80 mm in height so that the height was 80 mm, to obtain a layered body. Next, the side end face of this 80 mm×150 mm layered body was sliced with a woodworking slicer to obtain a secondary sheet. The obtained secondary sheet was sandwiched with protective films and lamination was performed using a rubber roll laminator heated to 40° C. by passing between a rubber roll with an upper and lower gap of 150 μm at a speed of 0.6 m/min to obtain the heat conduction sheet (I) of length 80 mm×width 150 mm×thickness 0.15 mm.

(Preparation 2 of Heat Conduction Sheet)

The secondary sheet was prepared in the same manner as (Preparation 1 of Heat Conduction Sheet), the obtained secondary sheet was sandwiched with protective films, and lamination was performed using a rubber roll laminator heated to 60° C. by passing between a rubber roll with an upper and lower gap of 0 μm at a speed of 0.6 m/min to obtain the heat conduction (II) of length 80 mm×width 150 mm×thickness 0.15 mm.

(Preparation 3 of Heat Conduction Sheet)

The secondary sheet was prepared in the same manner as (Preparation 1 of Heat Conduction Sheet), the obtained secondary sheet was sandwiched with protective films, and lamination was performed using a rubber roll laminator heated to 80° C. by passing between a rubber roll with an upper and lower gap of 0 μm at a speed of 0.6 m/min to obtain the heat conduction (III) of length 80 mm×width 150 mm×thickness 0.15 mm.

(Preparation 4 of Heat Conduction Sheet)

The secondary sheet was prepared in the same manner as (Preparation 1 of Heat Conduction Sheet), the obtained secondary sheet was sandwiched with protective films, and lamination was performed using a rubber roll laminator heated to 100° C. by passing between a rubber roll with an upper and lower gap of 0 μm at a speed of 0.6 m/min to obtain the heat conduction (IV) of length 80 mm×width 150 mm×thickness 0.15 mm.

The cross section of the heat conduction sheets (I) to (IV) were observed with SEM, and the angles (hereinafter also referred to as "orientation angles") between the plane directions of the scale-like particles and the surface of the heat conduction sheet for arbitrary 50 graphite particles (A) were measured. The average value of the orientation angles was 90 degrees, and it was recognized that the plane directions of the scale-like particles of the graphite particle (A) were oriented in the thickness direction of the heat conduction sheet.

(Arithmetic Mean Roughness)

The arithmetic mean roughness of each prepared heat conduction sheet was measured in accordance with JIS B 0601:2013.

Specifically, the surface of the heat conduction sheet was photographed at a lens magnification of 40 times with VR-3200 (manufactured by Keyence Corporation), and the arithmetic mean roughness of a range of 5000 μm×4000 μm was determined with analysis software VR-3000 (manufactured by Keyence Corporation).

Arithmetic mean roughness of each of the prepared heat conduction sheets (heat conduction sheets (I) to (IV)) was 3.074 μm, 2.056 μm, 1.697 μm and 1.497 μm, respectively.

(Measurement of Thermal Resistance)

After determining the thermal conductivity λ (W/mK) of each of the prepared heat conduction sheets was determined, and thermal resistance Rth (K·cm$^2$/W) was determined. First, each of the prepared heat conduction sheets was punched into a circle having a diameter of 14 mm, two 27 mm square copper plates having a thickness of 1 mm were prepared, and the heat conduction sheet punched was sandwiched at the center between the two copper plates. This was fixed with two clips having a strength of 23N to 24N. The applied pressure respectively corresponds to 0.3 MPa. The sample was heated in an oven at 165° C. for 1 hour. After cooling to room temperature (25° C.), the edges of the copper plate were fixed with epoxy adhesive so as not to slip, and the clips were removed to obtain a pressure bonded sample.

Subsequently, the thermal conductivity at 25° C. of the pressure bonded sample was measured using a thermal diffusivity measuring device (NETZCH Corp. "LFA447"). The thermal conductivity of the copper plate was measured in advance, and the thermal conductivity λ (W/mK) of the heat conduction sheet portion was determined by the three-layer method of the thermal diffusivity measuring device.

Next, the thermal resistance Rth (K·cm$^2$/W) was determined by the following Formula from the above thermal conductivity λ and the thickness t (mm) of the heat conduction sheet. The thickness t (mm) of the heat conduction sheet is a value obtained by subtracting the thicknesses of the two copper plates previously measured from the thickness of the pressure bonded sample. The thicknesses of the pressured bonded sample and the copper plate were measured by a micrometer. Three pressured bonded samples were prepared, each was measured for three shots, and the average value was adopted.

$$Rth = 10 \times t/\lambda$$

Further, after heat treatment at a temperature of 150° C. for 500 hours, heat resistance Rth (K·cm$^2$/W) was determined as described above.

The thermal resistances of the prepared heat conduction sheets (heat conduction sheets (I) to (IV)) were 0.111, 0.110, 0.089 and 0.107 in order.

Next, the resin component used for the measurement of the storage elastic modulus G' was prepared under the following conditions, and the heat conduction sheet used to measure compression set was prepared under the following conditions.

First, (B) component, (C) component, (D) component and (E) component at the same mixing ratio as the composition of the above-mentioned Example 1 except that the graphite particles as component (A) are not included were mixed to prepare a resin component used for the measurement of storage elastic modulus G'.

Further, the composition in above Example 1 was placed in an extruder and extruded into a flat plate having a width of 20 cm and a thickness of 1.5 mm to 1.6 mm to obtain a primary sheet. The obtained primary sheet is press punched using a 40 mm×150 mm die blade, and 61 sheets of the punched sheet were stacked, and a pressure was applied at 90° C. for 30 minutes in the stacking direction with the spacer of 80 mm in height so that the height was 80 mm, to obtain a layered body. Next, the side end face of this 80 mm×150 mm layered body was sliced with a woodworking slicer to obtain a secondary sheet. The obtained secondary sheet was sandwiched with protective films and lamination was performed using a rubber roll laminator heated to 40° C. by passing between a rubber roll with an upper and lower gap of 150 μm at a speed of 0.6 m/min to obtain the heat conduction sheet used to measure compression set of length 80 mm× width 150 mm×thickness 0.15 mm.

(Measurement of Storage Elastic Modulus G')

The storage elastic modulus G' of the prepared resin component was measured using a dynamic viscoelasticity measurement device (Anton Paar Co., Ltd., trade name: MCR-301) under the measurement conditions of a sine frequency of 1 Hz, a measurement temperature of 200° C. to 20° C., and a temperature change rate of 5° C./min.

Further, in the resin component used for the measurement of the above storage elastic modulus G', after heat-processing on the conditions of the temperature of 150° C. for 500 hours, the storage elastic modulus G' was determined as described above.

The results are shown in Tables 2 and 3.

(Measurement of Compression Set)

Permanent strain was measured after heating the heat conduction sheet of the thickness of 150 μm at 150° C. for 0 hour (without heating) and 500 hours respectively, using a microforce tester (Micro Tester 5948, manufactured by Instoron) to compress at 0.1 mm/min until the pressure applied to the heat conduction sheet per 1 cm² was pressurized to 20 Psi at a temperature of 150° C., after immediately after reaching 20 Psi, releasing at 0.1 mm/min until the pressure applied to the heat conduction sheet per 1 cm² reached 0 Psi, and then standing at room temperature (25° C.) for 30 minutes, and compression set (%) was measured based on the following Formula.

Compression set (%)=[($T_0$-$T_1$)/$T_0$]×100

$T_0$: Thickness (μm) of the heat conduction sheet before compression $T_1$: Thickness (μm) of the heat conduction sheet after applying compressive strain by a microforce tester, and standing at room temperature Further, in the heat conduction sheet prepared under the same conditions as the heat conduction sheet used to measure compression set, the heat resistance was measured.

The results are shown in Tables 2 and 3.

(Measurement of Polocity)

The prepared heat conduction sheet was punched into 1 cm² and the thickness was further measured at 5 points to determine the volume of the punched heat conduction sheet. Thereafter, the weight was measured by a precision electronic balance, and the bulk density ρ of the heat conduction sheet punched out was determined from the weight and the previously measured volume. Further, the true density ρ' of 1 cm² was determined from the specific gravities and volume proportions of all the materials included in this heat conduction sheet. Using these, the porosity P was calculated from the following Formula.

Porosity $P=[1-(\rho/\rho')]\times 100(\%)$ (1)

The porosity of each of the prepared heat conduction sheets (heat conduction sheets (I) to (IV)) was 11.0%, 7.3%, 6.8% and 4.5% in order.

Example 2

A composition including (A) component, (B) component, (C) component, (D) component, (E) component, and an antioxidant was prepared in the same manner as Example 1. The ratio of each component of the composition prepared in Example 2 is shown in Table 1. (C) Component and the antioxidant included in Example 2 are as follows.

Ethylene-propylene copolymer (manufactured by Mitsui Chemicals, Inc. "Lucant HC-3000X")

Hindered phenol-based antioxidant (manufactured by ADEKA Corporation, "AO-60")

(Comparative Examples 1 to 4)

Each material shown in the following Table 1 was put into 4 L pressure kneader at a mixing ratio of Table 1, and was kneaded under conditions of a final temperature of 170° C. to prepare each composition. The other polymers included in the compositions of Comparative Examples 1 to 4 are as follows.

Polybutene 3N (manufactured by NOF Corporation, number average molecular weight: 720, density: 0.880 g/cm³)

Polybutene 30 N (made by NOF Corporation, number average molecular weight: 1350, density: 0.899 g/cm³)

TABLE 1

| | Example 1 | Example 2 | Comparative Example 1 | Comparative Example 2 | Comparative Example 3 | Comparative Example 4 |
|---|---|---|---|---|---|---|
| (A) Component | Expanded graphite HGF-L 37.3% by volume | Expanded graphite HGF-L 37.1% by volume | Expanded graphite HGF-L 37.3% by volume | Expanded graphite HGF-L 37.3% by volume | Expanded graphite HGF-L 37.3% by volume | Expanded graphite HGF-L 37.3% by volume |
| (B) Component | Tetrax 6T 25.5% by volume | Tetrax 6T 25.4% by volume | Tetrax 6T 23.7% by volume | Tetrax 6T 21.6% by volume | Tetrax 6T 25.3% by volume | Tetrax 6T 25.5% by volume |
| (C) Component | Lucant HC-2000 22.1% by volume | Lucant HC-3000X 21.9% by volume | — | — | — | — |
| (D) Component | EOR 8407 9.3% by volume | EOR 8407 9.3% by volume | — | EOR 8407 7.4% by volume | EOR 8407 3.6% by volume | EOR 8407 9.3% by volume |
| (E) Component | Arkon P90 5.8% by volume | Arkon P90 5.8% by volume | Arkon P90 14.7% by volume | Arkon P90 11.7% by volume | Arkon P90 11.7% by volume | Arkon P90 5.8% by volume |

TABLE 1-continued

|  | Example 1 | Example 2 | Comparative Example 1 | Comparative Example 2 | Comparative Example 3 | Comparative Example 4 |
|---|---|---|---|---|---|---|
| Other polymers | — | — | Polybutene 3N 24.4% by volume | Polybutene 30N 22.1% by volume | Polybutene 30N 22.1% by volume | Polybutene 30N 22.1% by volume |
| Antioxidant | — | AO-60 0.5% by volume | — | — | — | — |
| Total Organic Components | 62.7% by volume | 62.4% by volume | 62.7% by volume | 62.7% by volume | 62.7% by volume | 62.7% by volume |
| Expanded Graphite | 37.3% by volume | 37.1% by volume | 37.3% by volume | 37.3% by volume | 37.3% by volume | 37.3% by volume |
| Total | 100% by volume | 100% by volume | 100% by volume | 100% by volume | 100% by volume | 100% by volume |

In Comparative Example 3, the heat conduction sheet (the heat conduction sheet (V) and the heat conduction sheet (VI)) used to measure the arithmetic mean roughness, the porosity and the thermal resistance were prepared under the same conditions of the heat conduction sheet (I) and the heat conduction sheet (II) in Example 1.

Further, also in Comparative Example 4, the heat conduction sheet (the heat conduction sheet (VII) and the heat conduction sheet (VIII)) used to measure the arithmetic mean roughness, the porosity and the thermal resistance were prepared under the same conditions of the heat conduction sheet (I) and the heat conduction sheet (II) in Example 1.

In the heat conduction sheet (V) and the heat conduction sheet (VII) prepared, the arithmetic mean roughness, the porosity and the thermal resistance were measured under the same conditions of Example 1, and in the heat conduction sheet (VI) and the heat conduction sheet (VIII) prepared, the arithmetic mean roughness and the thermal resistance were measured under the same conditions of Example 1

In the heat conduction sheet (V) of Comparative Example 3, the arithmetic mean roughness was 3.809 μm, the porosity was 13.9%, and the thermal resistance was 0.113.

In the heat conduction sheet (VI) of Comparative Example 3, the arithmetic mean roughness was 2.346 μm and the thermal resistance was 0.112.

In the heat conduction sheet (VII) of Comparative Example 4, the arithmetic mean roughness was 3.435 μm, the porosity was 11.0%, and the thermal resistance was 0.112.

In the heat conduction sheet (VIII) of Comparative Example 4, the arithmetic mean roughness was 2.274 μm and the thermal resistance was 0.111.

Further, in Example 2, and Comparative Example 1 to Comparative Example 4, the resin component used for the measurement of the storage elastic modulus and the heat conduction sheet used to compression set were prepared under the same conditions (the condition described in paragraph [0137]) of Example 1. The storage elastic modulus G', the compression set and the thermal resistance were measured under the same conditions of Example 1.

The results are shown in Tables 2 and 3.

TABLE 2

| Untreated | Example 1 | Example 2 | Comparative Example 1 | Comparative Example 2 | Comparative Example 3 | Comparative Example 4 |
|---|---|---|---|---|---|---|
| G' (150° C., Pa · s) | 11.9 | 16.5 | 0.5 | 2.5 | 2.1 | 7.0 |
| Compression Set | 2.0 | 0.7 | 4.7 | 3.3 | 4.3 | 0.7 |
| Heat Resistance | 0.111 | 0.107 | 0.123 | 0.113 | 0.113 | 0.112 |

TABLE 3

| 150° C.-500 hours after processing | Example 1 | Example 2 | Comparative Example 1 | Comparative Example 2 | Comparative Example 3 | Comparative Example 4 |
|---|---|---|---|---|---|---|
| G' (150° C., Pa · s) | 7.5 | 11.4 | 0.4 | 1.4 | 0.8 | 3.8 |
| Compression Set | 2.0 | 0.7 | 5.3 | 4.7 | 5.3 | 5.3 |
| Heat Resistance | 0.102 | 0.101 | 0.146 | 0.125 | 0.130 | 0.117 |

From the above, in the heat conduction sheet of Example 1 including (A) component to (D) component, particularly the heat conduction sheets (II) to (IV), for example, it was shown that the thermal resistance was small and the thermal conductivity was excellent as compared with the heat conduction sheets (V) to (VIII) of Comparative Example 3 and Comparative Example 4.

Further, as shown in Tables 2 and 3, the heat conduction sheets of Example 1 and Example 2 including (A) component to (D) component, it was shown that the thermal resistance was small and the thermal conductivity was excellent as compared with the heat conduction sheets of Comparative Example 1 to Comparative Example 4.

Further, as shown in Table 2, in the heat conduction sheets of Example 1 and Example 2 having the storage elastic modulus G' at 150° C. of 8 Pa·s or more, it was shown that the thermal resistance was small and the thermal conductivity was excellent as compared with the heat conduction sheets of Comparative Example 1 to Comparative Example 4.

In particular, as shown in Table 3, in the heat conduction sheets of Example 1 and Example 2 in which the storage elastic modulus G' after treatment at 150° C. is 5 Pa·s or more, it was shown that the thermal resistance was small and the thermal conductivity was excellent as compared with the heat conduction sheets of Comparative Example 1 to Comparative Example 4.

Further, as shown in Table 3, in the heat conduction sheets of Example 1 and Example 2 having compression set (%) of 4% or less after treatment at 150° C., it was shown that the thermal resistance was small and the thermal conductivity was excellent as compared with the heat conduction sheets of Comparative Example 1 to Comparative Example 4.

Further, in the heat conduction sheets (II) to (IV) of Example 1 in which the arithmetic mean roughness of the surface is 2.1 μm or less, it was shown that the thermal resistance was small and the thermal conductivity was excellent as compared with the heat conduction sheets (V) to (VIII) of Comparative Example 3 and Comparative Example 4.

Further, in the heat conduction sheets (II) to (IV) of Example 1 in which the porosity is less than 10%, it was shown that the thermal resistance was small and the thermal conductivity was excellent as compared with the heat conduction sheets (V) and (VII) of Comparative Example 3 and Comparative Example 4.

All publications, patent applications, and technical standards mentioned in the present specification are herein incorporated by reference to the same extent as if each individual publication, patent application, and technical standard were specifically and individually indicated to be incorporated by reference.

The invention claimed is:

1. A heat conduction sheet, comprising:
    at least one kind of graphite particle (A) selected from the group consisting of scale-like particles, ellipsoidal particles and rod-like particles;
    a polymer (B) having an isobutylene structure, the polymer (B) comprising at least one of a copolymer of isobutene and styrene in which a content ratio of the isobutylene structure in the copolymer of isobutene and styrene is from 60% by mass to 95% by mass, a copolymer of isobutene and ethylene in which a content ratio of the isobutylene structure in the copolymer of isobutene and ethylene is from 60% by mass to 95% by mass, and a homopolymer of isobutene;
    an ethylene-propylene copolymer (C); and
    an ethylene octene elastomer (D),
    wherein a content ratio of the polymer (B) in the heat conduction sheet is from 10% by volume to 40% by volume, and
    wherein, in a case of scale-like particles, a plane direction of the particle is oriented in a thickness direction of the heat conduction sheet, and in a case of ellipsoidal particles or rod-like particles, a long axis direction of the particle is oriented in the thickness direction of the heat conduction sheet.

2. The heat conduction sheet according to claim 1, wherein the graphite particle (A) includes a scale-like particle that comprises an expanded graphite particle.

3. The heat conduction sheet according to claim 1, further comprising an alicyclic hydrocarbon resin (E).

4. The heat conduction sheet according to claim 1, further comprising an antioxidant.

5. The heat conduction sheet according to claim 1, wherein a content ratio of the graphite particle (A) is from 15% by volume to 50% by volume.

6. A method of manufacturing the heat conduction sheet according to claim 1, comprising:
    preparing a composition comprising: at least one kind of graphite particle (A) selected from the group consisting of scale-like particles, ellipsoidal particles and rod-like particles; a polymer (B) having an isobutylene structure; an ethylene-propylene copolymer (C); and an ethylene octene elastomer (D);
    forming the composition into a sheet;
    producing a layered body by stacking a plurality of the sheets, folding one of the sheets, or rolling one of the sheets; and
    slicing a side end face of the layered body.

7. A heat dissipating device, comprising the heat conducting sheet according to claim 1 interposed between a heat generating body and a heat dissipating body.

8. The heat conduction sheet according to claim 1, wherein a content ratio of the polymer (B) in the heat conduction sheet is from 20% by volume to 30% by volume.

9. A heat conduction sheet, comprising:
    at least one kind of graphite particle (A) selected from the group consisting of scale-like particles, ellipsoidal particles and rod-like particles; and
    a resin component having a storage elastic modulus G' at 150° C. of 8 Pas or more including a polymer (B) having an isobutylene structure, the polymer (B) comprising at least one of a copolymer of isobutene and styrene in which a content ratio of the isobutylene structure in the copolymer of isobutene and styrene is from 60% by mass to 95% by mass, a copolymer of isobutene and ethylene in which a content ratio of the isobutylene structure in the copolymer of isobutene and ethylene is from 60% by mass to 95% by mass, and a homopolymer of isobutene,
    wherein a content ratio of the polymer (B) in the heat conduction sheet is from 10% by volume to 40% by volume, and
    wherein, in a case of scale-like particles, a plane direction of the particle is oriented in a thickness direction of the heat conduction sheet, and in a case of ellipsoidal particles or rod-like particles, a long axis direction of the particle is oriented in the thickness direction of the heat conduction sheet.

10. The heat conduction sheet according to claim 9, wherein a content ratio of the polymer (B) in the heat conduction sheet is from 20% by volume to 30% by volume.

11. The heat conduction sheet according to claim 9, wherein the graphite particle (A) includes a scale-like particle that comprises an expanded graphite particle.

12. The heat conduction sheet according to claim 9, wherein a content ratio of the graphite particle (A) is from 15% by volume to 50% by volume.

13. A heat dissipating device, comprising the heat conducting sheet according to claim 9 interposed between a heat generating body and a heat dissipating body.

14. A heat conduction sheet, comprising:
at least one kind of graphite particle (A) selected from the group consisting of scale-like particles, ellipsoidal particles and rod-like particles; and
a resin component including a polymer (B) having an isobutylene structure, the polymer (B) comprising at least one of a copolymer of isobutene and styrene in which a content ratio of the isobutylene structure in the copolymer of isobutene and styrene is from 60% by mass to 95% by mass, a copolymer of isobutene and ethylene in which a content ratio of the isobutylene structure in the copolymer of isobutene and ethylene is from 60% by mass to 95% by mass, and a homopolymer of isobutene, wherein:
one of the following (1) to (3) is satisfied,
(1) compression set (%) after treatment at 150° C. is 4% or less,
(2) an arithmetic mean roughness of a surface of the sheet is 2.1 μm or less,
(3) a porosity of the sheet is 10% or less,
wherein a content ratio of the polymer (B) in the heat conduction sheet is from 10% by volume to 40% by volume, and
in a case of scale-like particles, a plane direction of the particle is oriented in a thickness direction of the heat conduction sheet, and in a case of ellipsoidal particles or rod-like particles, a long axis direction of the particle is oriented in the thickness direction of the heat conduction sheet.

15. The heat conduction sheet according to claim 14, wherein a content ratio of the polymer (B) in the heat conduction sheet is from 20% by volume to 30% by volume.

16. The heat conduction sheet according to claim 14, wherein the graphite particle (A) includes a scale-like particle that comprises an expanded graphite particle.

17. The heat conduction sheet according to claim 14, wherein a content ratio of the graphite particle (A) is from 15% by volume to 50% by volume.

18. A heat dissipating device, comprising the heat conducting sheet according to claim 14 interposed between a heat generating body and a heat dissipating body.

* * * * *